United States Patent [19]
d'Heureuse et al.

[11] Patent Number: 4,652,118
[45] Date of Patent: Mar. 24, 1987

[54] DEVICE FOR MOUNTING FILM IN-REGISTER FOR PRODUCING PRINTING PLATES FOR SMALL OFFSET PRINTING PRESSES

[75] Inventors: Walter d'Heureuse, Ladenburg; Rolf Demmerle, Schriesheim, both of Fed. Rep. of Germany

[73] Assignee: Heidelberger Druckmaschinen AG, Heidelberg, Fed. Rep. of Germany

[21] Appl. No.: 695,216

[22] Filed: Jan. 25, 1985

[30] Foreign Application Priority Data

Jan. 26, 1984 [DE] Fed. Rep. of Germany ... 8402101[U]

[51] Int. Cl.$^4$ .............................................. G03B 27/02
[52] U.S. Cl. ....................................... 355/79; 355/72; 355/75
[58] Field of Search ................ 355/79, 72, 75; 352/97

[56] References Cited
U.S. PATENT DOCUMENTS
3,630,611 12/1971 Hoyer et al. ........................... 355/75

Primary Examiner—Monroe H. Hayes
Attorney, Agent, or Firm—Herbert L. Lerner; Laurence A. Greenberg

[57] ABSTRACT

A device for mounting film in register for producing printing plates for small offset printing presses includes a universally applicable template having a plurality of differently shaped pins each corresponding to conventionally used register-hole systems for suspending a superimposed register sheet serving as an original, and a mounting foil serving as a film mounting, the register sheet and the mounting foil having register holes of at least one of the conventionally used systems formed therein and matching the shape of one of the pins.

5 Claims, 4 Drawing Figures

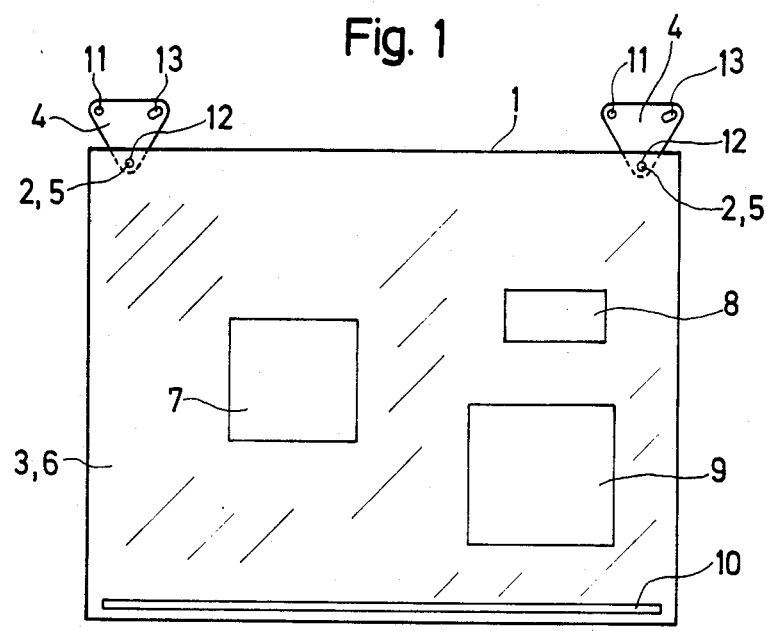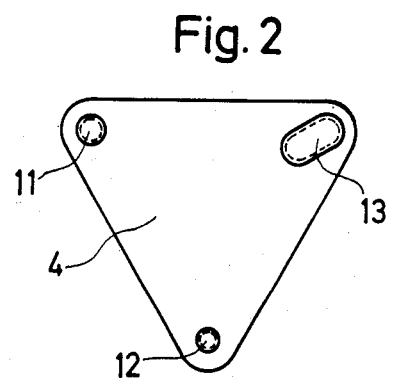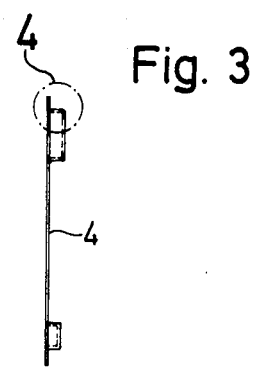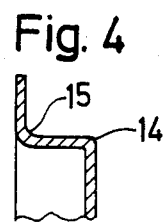

DEVICE FOR MOUNTING FILM IN-REGISTER FOR PRODUCING PRINTING PLATES FOR SMALL OFFSET PRINTING PRESSES

The invention relates to a device for mounting film inregister for producing printing plates for small offset printing presses and, more particularly, while using register sheets serving as originals and mounting foils serving as a film mounting.

Small offset printing presses coming into use worldwide are conventionally provided with previously perforated metal, synthetic material or paper printing foils. These "printing plates" are drawn into the cylinder channel of the plate cylinder of the printing press, being clamped onto a hook strip at the beginning and at the end of the plate so that they are disposed in good contact with the surface of the cylinder. The aforementioned hook strip has gripper fingers which are disposed side-by-side at regularly spaced intervals, and engage in corresponding rows of holes formed in the printing plate. Various different systems exist with respect to the shape and arrangement of these rows of holes. The most common are:

1. Round hole having a diameter of 4.5 mm with a spacing between the holes of 12.5 mm;
2. Round hole having a diameter of 4.0 mm with a spacing between the holes of 12.7 mm, and known as "pinbar"; and
3. Slot or oblong hole having a width of 5.5 mm and a length of 11.0 mm with a spacing between the slots of 29.67 mm, and known as "hookbar".

The suppliers of small offset printing presses of a format or size class up to about German Engineering Norm (DIN) A3 have, opted very extensively for a respective one of these types of holes or perforations. Only at the express desire of their customers, will these suppliers equip the press also with a hook strip for any of the other types of register holes or perforations. In many cases a special plate cylinder is then required.

To manufacture the printing plate per se, a register sheet formed with the register holes of one of the foregoing systems is frequently used as an original whereon the films to be printed are disposed in correct position. A mounting foil used for producing a printing plate and likewise having these register holes formed therein is placed in-register on this register sheet, and then the individual films are mounted on the mounting foil in accordance with the original constituted by the register sheet which is copied or visible therebeneath.

Proceeding therefrom, it is an object of the invention to provide a device for mounting film in-register for producing printing plates for small offset printing presses which offers auxiliary means by which, taking into account the existing multitude of systems of register holes in the small offset field, an in-register mounting of the printing image on the type form via a register sheet and a mounting foil may be afforded.

With the foregoing and other objects in view, there is provided, in accordance with the invention, a device for mounting film in register for producing printing plates for small offset printing presses, comprising a universally applicable template having a plurality of differently shaped pins each corresponding to conventionally used register-hole systems for suspending a superimposed register sheet serving as an original, and a mounting foil serving as a film mounting, the register sheet and the mounting foil having register holes of at least one of the conventionally used systems formed therein and matching the shape of one of the pins.

In accordance with another feature of the invention, there is provided a device including two of the templates, corresponding register holes being formed respectively at left hand and right hand sides of a leading edge of the register sheet and the mounting foil.

In accordance with an added feature of the invention, the pins have shapes respectively corresponding to register holes including a round hole having a diameter of 4.5 mm, a round hole having a diameter of 4.0 mm and a slot-hole having a width of 5.5 mm and a length of 11.0 mm.

In accordance with a further feature of the invention, the template is formed of dimensionally stable metallic material or plastic material, and the pins have rounded edges for facilitating the accommodation of the register holes of the register sheet and the mounting foil.

In accordance with a concomitant feature of the invention, the template is a flat plate in the form of an equilateral triangle, the register pins being uniformly distributed thereon in respective vicinities of the corners of the triangle.

Other features which are considered as characteristic for the invention are set forth in the appended claims.

Although the invention is illustrated and described herein as embodied in a device for mounting film in-register for producing printing plates for small offset printing presses, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which:

FIG. 1 is an elevational view of the mounting device according to the invention formed as templates, and shows how films are mounted;

FIG. 2 is an enlarged fragmentary view of FIG. 1 showing an embodiment of one of the templates in greater detail;

FIG. 3 is a side elevational view of FIG. 2;

FIG. 4 is an enlarged fragmentary sectional view of FIG. 3 showing the detail enclosed by the circle 4 shown in phantom.

Referring now to the drawing and first, particularly, to FIG. 1 thereof, there is shown a template 4 according to the invention, which is in the form of a flat plate, respectively disposed at both the left-hand and right-hand sides of the front or leading edge 1 of a register sheet 3 formed with register holes 2, the register sheet 3 being suspended by the punched-out register holes 2 thereof on corresponding pins or cams 11. A transparent mounting foil 6 is placed congruently or in alignment and, due to corresponding register holes, in-register on the register sheet 3 and likewise suspended on the pins 11 so that it can then be provided with the films 7, 8, 9 and 10, which are to be printed, in accordance with the original which is constituted by the register sheet 3 visible or copied under the mounting foil 6, in order then to be brought into contact with the offset printing plate so that an in-register, accurately positioned plate copy is assured.

FIG. 2 shows an enlarged view of a template 4 which, in the embodiment of the invention, is preferably constructed as an equilateral triangle, and takes into account the three principally used systems of register holes in that pins or cams 11, 12 and 13 matching, respectively, a round hole having a diameter of 4.5 mm; a round hole having a diameter of 4.0 mm (pinbar) and a slot or oblong hole having a width of 5.5 mm and a length of 11.0 mm (hookbar), are uniformly distributed, respectively, in the region of each corner of the triangular template. The template 4 per se may preferably be formed of metallic material or synthetic material and shoul be dimensionally stable.

The enlarged sectional view of FIG. 3 shown in the interest of completeness in FIG. 4 illustrates the contour or shape of the pin or cam ]3 which is provided with rounded portions 14 and 15 at suitable locations (edges in order thereby to facilitate the adjustment of the register sheet 3 and the mounting foil 6 and to avoid damage to the register holes formed therein.

We claim:

1. Device for mounting film in register for producing printing plates for small offset printing presses, comprising a pair of templates, respectively, having a plurality of differently shaped pines each corresponding to conventionally used register-hole system for suspending a superimposed register sheet serving as an original, and a mounting foil serving as a film mounting, the register sheet and the mounting foil having register holes of at least one of of the conventionally used systems formed therein and matching the shape of one of the pins of each of said pair of templates.

2. Device according to claim 1 wherein corresponding register holes are formed respectively at left hand and right hand sides of a leading edge of the register sheet and the mounting foil.

3. Device according to claim 1, wherein said pins have shapes respectively corresponding to register holes including a round hole having a diameter of 4.5 mm, a round hole having a diameter of 4.0 mm and a slot-hole having a width of 5.5 mm and a length of 11.0 mm.

4. Device according to claim 1 wherein each of said templates is formed of dimensionally stable metallic material or plastic material, and said pins have rounded edges for facilitating the accommodation of the register holes of the register sheet and the mounting foil.

5. Device according to claim 1 wherein each of said templates is a flat plate in the form of an equilateral triangle, said register pins being uniformly distributed thereon in respective vicinities of the corners of said triangle.

* * * * *